US009627785B1

(12) United States Patent
Melchor Saucedo et al.

(10) Patent No.: US 9,627,785 B1
(45) Date of Patent: Apr. 18, 2017

(54) ELECTRICAL DISTRIBUTION CENTER

(71) Applicant: DELPHI TECHNOLOGIES, INC., Troy, MI (US)

(72) Inventors: Gustavo Eric Melchor Saucedo, Chihuahua (MX); Jesus R. Morales, Chihuahua (MX)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 15/189,576

(22) Filed: Jun. 22, 2016

(51) Int. Cl.
| H01R 12/70 | (2011.01) |
| H01R 13/506 | (2006.01) |
| H01R 13/512 | (2006.01) |
| H01R 13/518 | (2006.01) |
| H01R 13/73 | (2006.01) |

(52) U.S. Cl.
CPC ....... *H01R 12/7017* (2013.01); *H01R 13/506* (2013.01); *H01R 13/512* (2013.01); *H01R 13/518* (2013.01); *H01R 13/73* (2013.01)

(58) Field of Classification Search
CPC .. H01R 13/6215; H01R 13/631; H05K 7/026; B60R 16/0238
USPC .............................................. 439/76, 2, 364
See application file for complete search history.

(56) References Cited

U.S. PATENT DOCUMENTS

| 5,788,529 | A | * | 8/1998 | Borzi | .................. | H01R 9/2458 |
| | | | | | | 29/830 |
| 6,027,360 | A | * | 2/2000 | Jenkins | .............. | H01R 13/6215 |
| | | | | | | 439/248 |
| 6,152,758 | A | * | 11/2000 | Matsuoka | .......... | H01R 13/6215 |
| | | | | | | 439/247 |
| 6,257,918 | B1 | * | 7/2001 | Yamamoto | ......... | H01R 13/6315 |
| | | | | | | 439/34 |
| 6,443,779 | B2 | * | 9/2002 | Suzuki | ................. | H01R 9/2425 |
| | | | | | | 439/557 |
| 6,679,708 | B1 | * | 1/2004 | Depp | .................... | H01R 9/2466 |
| | | | | | | 361/752 |
| 6,905,346 | B2 | * | 6/2005 | Momota | ................ | H01R 9/226 |
| | | | | | | 361/833 |
| 7,727,022 | B2 | | 6/2010 | Polehonki et al. | | |
| 7,931,479 | B1 | * | 4/2011 | De La Reza | ....... | B60R 16/0238 |
| | | | | | | 439/76.2 |
| 9,282,655 | B2 | | 3/2016 | Stern et al. | | |
| 2002/0168882 | A1 | * | 11/2002 | Chiriku | ................. | H01R 12/58 |
| | | | | | | 439/76.2 |
| 2012/0064741 | A1 | * | 3/2012 | Kawaguchi | ............ | H01R 9/226 |
| | | | | | | 439/76.2 |

* cited by examiner

Primary Examiner — Gary Paumen
(74) Attorney, Agent, or Firm — Robert J. Myers

(57) ABSTRACT

An electrical distribution center includes a bracket. A mounting plate is secured to the bracket and includes an aperture having a perimeter. An electrical connector is disposed within the aperture and includes locating structure that is captured between the perimeter and the bracket to align and to retain the electrical connector relative to the bracket. One locating structure includes spring arms that cooperate with notches provided by the aperture. Another locating structure includes an edge captured beneath a periphery of the aperture. The mounting plate is snap-fit to the bracket over the electrical connectors.

15 Claims, 7 Drawing Sheets

ELECTRICAL DISTRIBUTION CENTER

TECHNICAL FIELD OF THE INVENTION

This disclosure relates to an electrical distribution center used in, for example, automotive applications under the vehicle's hood.

BACKGROUND OF THE INVENTION

Electrical distribution centers are widely used in automobiles. The electrical distribution center is a central junction box or block system designed as a standalone assembly which can package various fuses, relays, and other electrical devices in a central location. Such electrical distribution centers include provisions for electrically connecting a power source and electrical devices that are housed in the junction block via electrical wiring harness connectors. Thus, power is supplied and control signals are provided to various electrical systems of the automobile such as an air conditioning system, a fuel system, lighting circuits, instrument panels and to engine and auxiliary systems such as an anti-lock brake system. The electrical distribution centers not only reduce costs by consolidating these various functions into one block, but the electrical distribution centers also reduce the number of cut and spliced leads, which help to ensure reliability.

One type of electrical distribution center includes a circuit board sandwiched between upper and lower housings. Multiple connectors are received within a bracket, which acts as a splash shield, and are electrically connected to the circuit board at an underside of the lower housing. The electrical components are electrically connected to the circuit board at an upper side of the upper housing, and an access cover may be secured over the electrical components.

The connectors must be aligned with the other electrical distribution center structures to ensure ease of assembly and electrical continuity with the circuit board. Typically, alignment has been provided by a threaded fastener that is passed through the upper and lower housings, through each of the connectors, and into the bracket, which has a corresponding stud for each fastener. Thus, for a four-connector electrical distribution center, eight fasteners must be used. Additionally, the electrical connectors must be sized larger to accommodate its respective fastener. Using this fastening arrangement adds cost to the electrical distribution center.

What is needed is an electrical distribution center and method for assembling the same that is both cost effective and easy to assemble while providing reliable electrical continuity.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF THE INVENTION

In one exemplary embodiment, an electrical distribution center includes a bracket. A mounting plate is secured to the bracket and includes an aperture having a perimeter. An electrical connector is disposed within the aperture and includes a locating structure that is captured between the perimeter and the bracket to align and to retain the electrical connector relative to the bracket.

In a further embodiment of the above, the bracket includes at least one retaining feature configured to interlock with the mounting plate in an assembled condition.

In a further embodiment of any of the above, the retaining feature includes perimeter tabs that cooperate with an outer periphery of the mounting plate.

In a further embodiment of any of the above, the retaining feature includes fingers that cooperate with slots in the mounting plate.

In a further embodiment of any of the above, the mounting plate includes a plurality of the apertures. A corresponding plurality of the electrical connectors are each arranged in a respective one of the apertures. The bracket includes a first fastening element and comprising a second fastening element that threadingly engages the first fastening element in an assembled condition. At least one of the first and second fastening elements passes through the mounting plate outside of the electrical connectors.

In a further embodiment of any of the above, a circuit board is arranged between upper and lower housings. The circuit board is electrically engaged with the electrical connectors on a lower side of the lower housing.

In a further embodiment of any of the above, electrical components are electrically engaged with the circuit board on an upper side of the upper housing. A lower side of the upper housing faces an upper side of the lower housing. Electrical terminals extend from the circuit board into the upper and lower housings.

In a further embodiment of any of the above, the bracket includes a perimeter wall with a window. A grommet supports a wire bundle terminating in the electrical connector. The grommet is received in the window and is retained in the bracket by the lower housing.

In a further embodiment of any of the above, the locating structure includes spring arms that cooperate with notches provided by the aperture.

In a further embodiment of any of the above, the locating structure includes an edge captured beneath a periphery of the aperture.

In another exemplary embodiment, a method of assembling an electrical distribution center includes the steps of arranging an electrical connector within a bracket and inserting a mounting plate with an aperture into the bracket over the electrical connector to align and retain the electrical connector relative to the bracket with the aperture.

In a further embodiment of any of the above, a lower housing is installed onto the bracket over the mounting plate and electrical connectors.

In a further embodiment of any of the above, a circuit board is electrically connected into the electrical connector from an upper side of the lower housing.

In a further embodiment of any of the above, lower housing is installed onto the upper housing. Electrical components are electrically connected to the circuit board from an upper side of the upper housing.

In a further embodiment of any of the above, a grommet that supports a wire bundle terminating in the electrical connector is slide into a window of the bracket. The grommet is retained in the bracket with the lower housing.

In a further embodiment of any of the above, the upper and lower housings are snapped to one another while snapping the upper housing to the bracket.

In a further embodiment of any of the above, a second fastening element is threaded to a first fastening element supported by the bracket to clamp the bracket, the mounting plate, the electrical connector, the upper housing, the circuit board and the lower housing to one another to provide an assembled electrical distribution center.

In a further embodiment of any of the above, the first and second fastening elements are arranged outside of the electrical connector.

In a further embodiment of any of the above, the inserting step includes snapping spring arms on the electrical connector into the aperture.

In a further embodiment of any of the above, the inserting step includes capturing an edge of the electrical connector with a periphery of the aperture.

BRIEF DESCRIPTION OF THE SEVERAL VIEWS OF THE DRAWING

The disclosure can be further understood by reference to the following detailed description when considered in connection with the accompanying drawings wherein.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

DETAILED DESCRIPTION OF THE INVENTION

Figure 1:
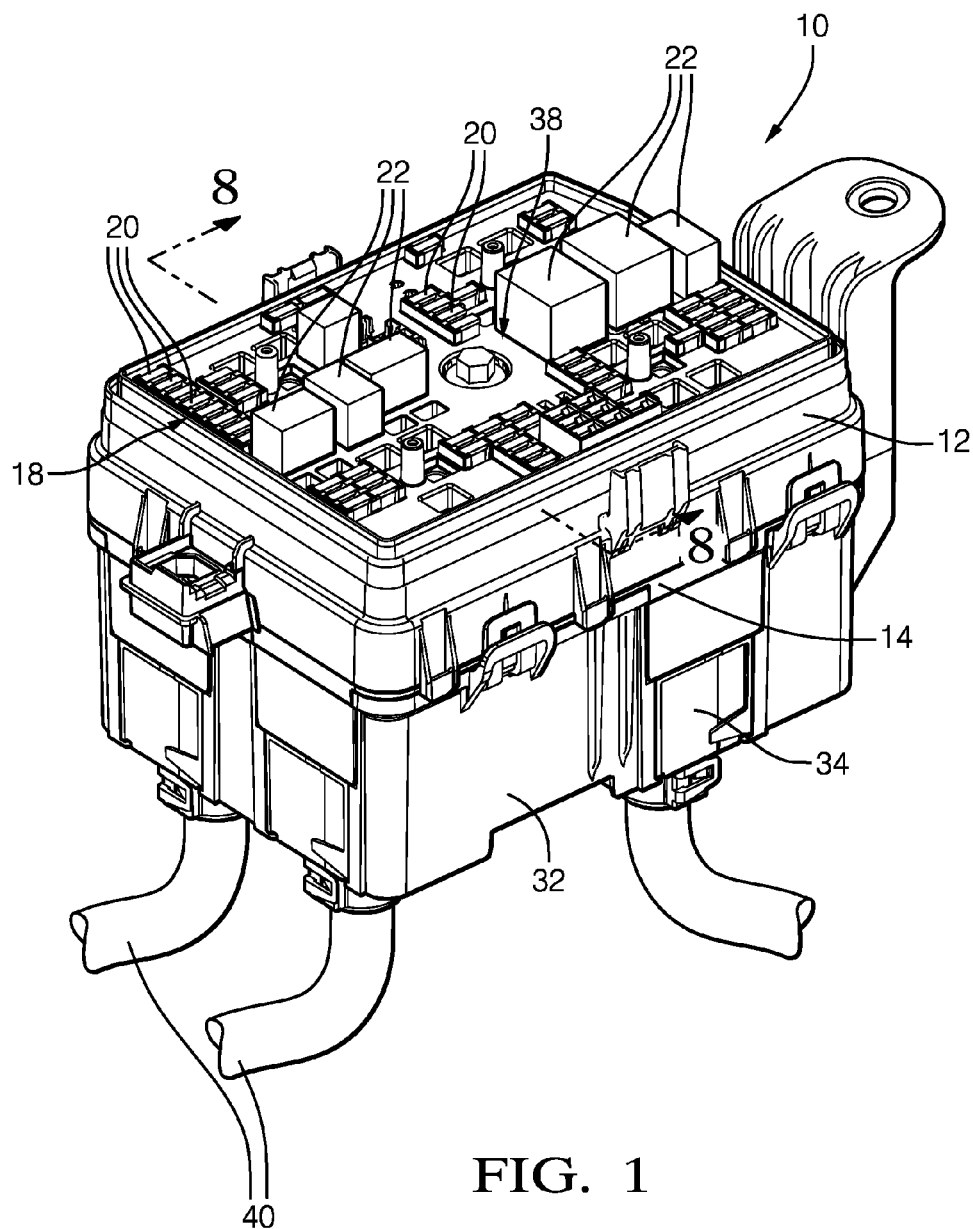
FIG. 1 is a perspective view of an electrical distribution center in an assembled condition.
Figure 2:
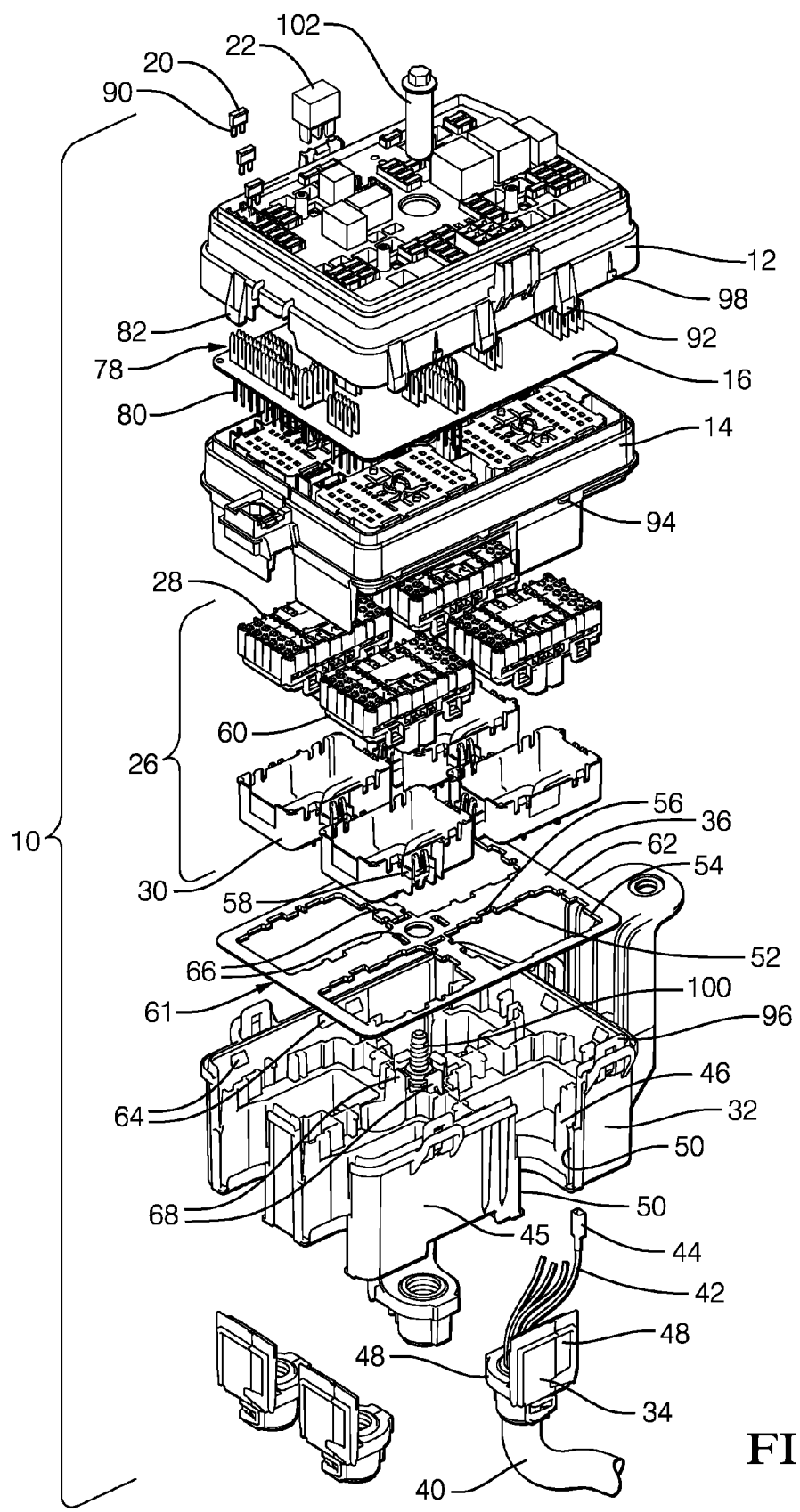
FIG. 2 is an exploded perspective view of the electrical distribution center shown in FIG. 1.

An example electrical distribution center 10 is shown in FIGS. 1 and 2. The electrical distribution center 10 includes upper and lower housings 12, 14 secured about a circuit board 16. The upper housing 12 supports electrical components 18, such as fuses 20 and relays 22 that are electrically connected to the circuit board 16. An access cover (not shown) may be secured to the upper housing 12 to protect the electrical components 18.

The circuit board 16 is electrically engaged with electrical connectors 26, which include first and second connector portions 28, 30 that house wire terminals 44 connected to wires 42 of a wire bundle 40 (FIG. 2). In the example, the electrical distribution center 10 includes four electrical connectors 26, but it should be understood that greater or fewer electrical connectors can be used.

Figure 3:
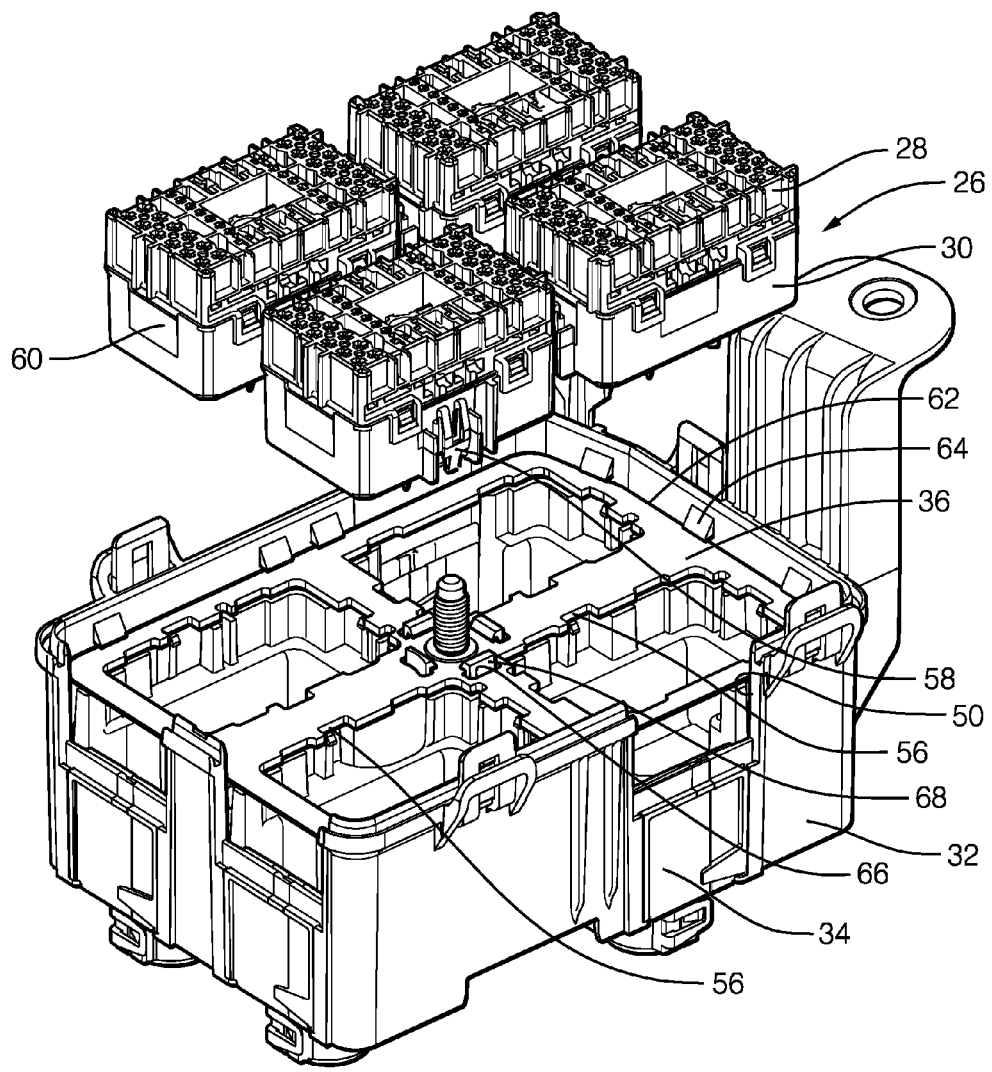
FIG. 3 is an exploded perspective view of the mounting plate secured to a bracket with electrical connectors removed from beneath a mounting plate for clarity.

Referring to FIGS. 2 and 3, a grommet 34 supports each wire bundle 40 with respect to a bracket 32 and provides strain relief. A perimeter wall 45 of the bracket 32 includes windows 46 that receive the grommets 34. In one example, lateral edges 48 of the grommets 34 are slidingly received in grooves 50 provided by the perimeter wall 45 during assembly after the wire bundle 40 has been passed through the window 46.

In the example, the bracket 32 includes at least one retaining feature configured to interlock with a mounting plate 36, which is used to locate the electrical connectors 26 in an assembled condition. For example, the retaining feature is provided by perimeter tabs 64 interiorly located on the perimeter wall 45. An outer periphery 62 of the mounting plate 36 cooperates with the perimeter tabs 64 to lock the mounting plate 36 to the bracket 32, best shown in FIG. 3. Another retaining feature is provided by fingers 68 that cooperate with slots 66 in the mounting plate 36 at or near its center in the example. The mounting plate 36 is secured to the bracket 32 after the grommets 34 are arranged in the windows 46 and with the electrical connectors 26 installed in the bracket 32.

A fastening arrangement 38 is used to clamp the entire assembly together once all the components of the electrical distribution center 10 are snapped together in the assembled condition (FIG. 1). The fastening arrangement 38 is centrally located, which better distributes the clamping load across the entire electrical distribution center 10. Referring to FIG. 2, in one example, the fastening arrangement 38 is provided by a first fastening element 100, which may be a T-bolt or stud secured to the bracket 32 and located interiorly of the fingers 68. The fastening arrangement 38 includes a second fastening element 102, which may be a barrel nut, that threadably engages the first fastening element 100 when in the assembled condition. As can be appreciated by the figures, at least one of the first and second fastening elements 100, 102 passes through the mounting plate 36 outside of the electrical connectors 26. That is, individual fastening elements are not used for each electrical connector.

Figure 4:
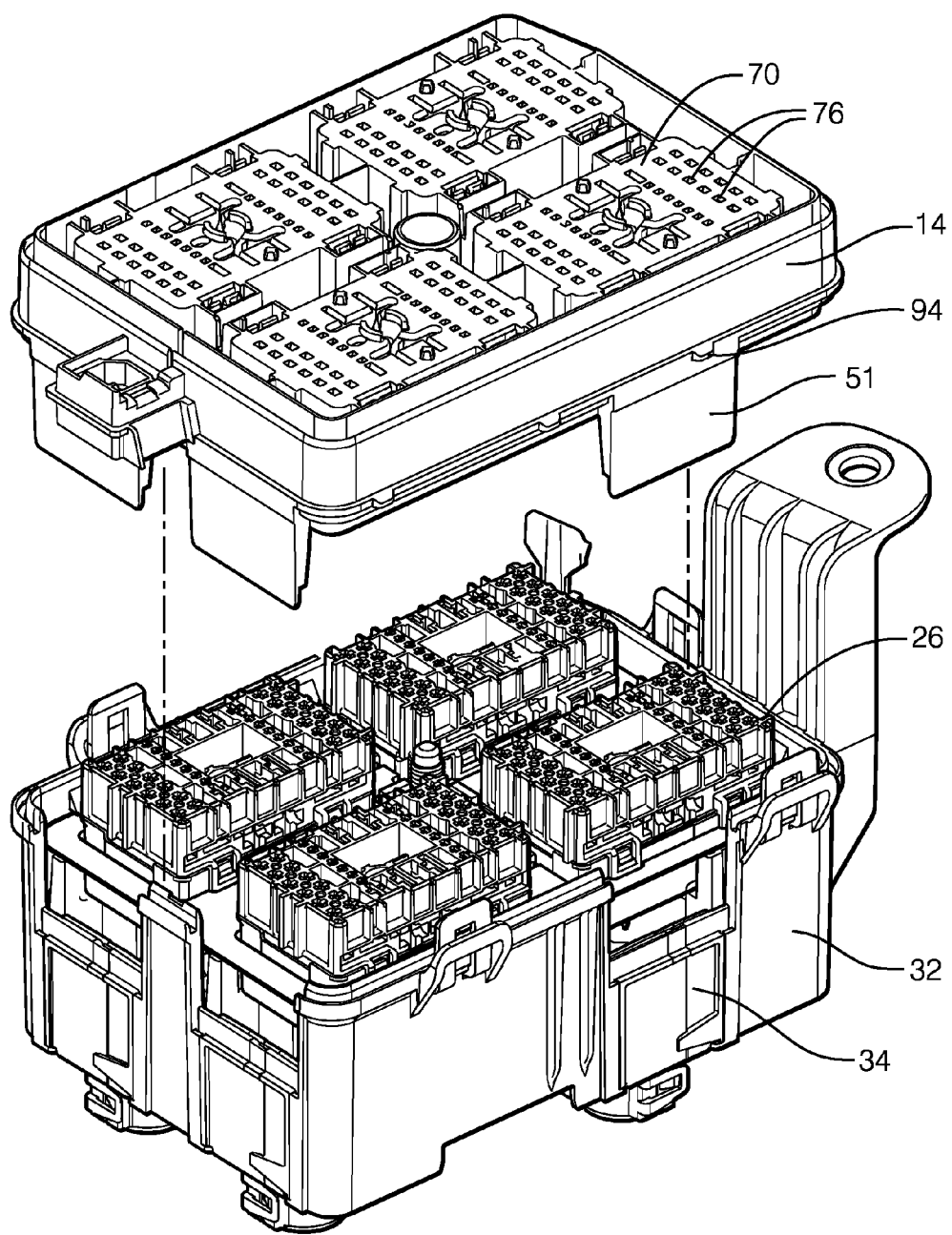
FIG. 4 is an exploded perspective view similar to that of FIG. 3, but with the electrical connectors installed and a lower housing removed.

The mounting plate 36, which is aluminum, for example, includes an aperture 52 having a perimeter 54. The electrical connectors 26 protrude through the apertures 52 when assembled (FIG. 4). Locating structures are provided on the electrical connector 26 that are captured between the perimeter 54 and the bracket 32 to align and retain the electrical connectors 26 relative to the bracket 32.

Figure 5:
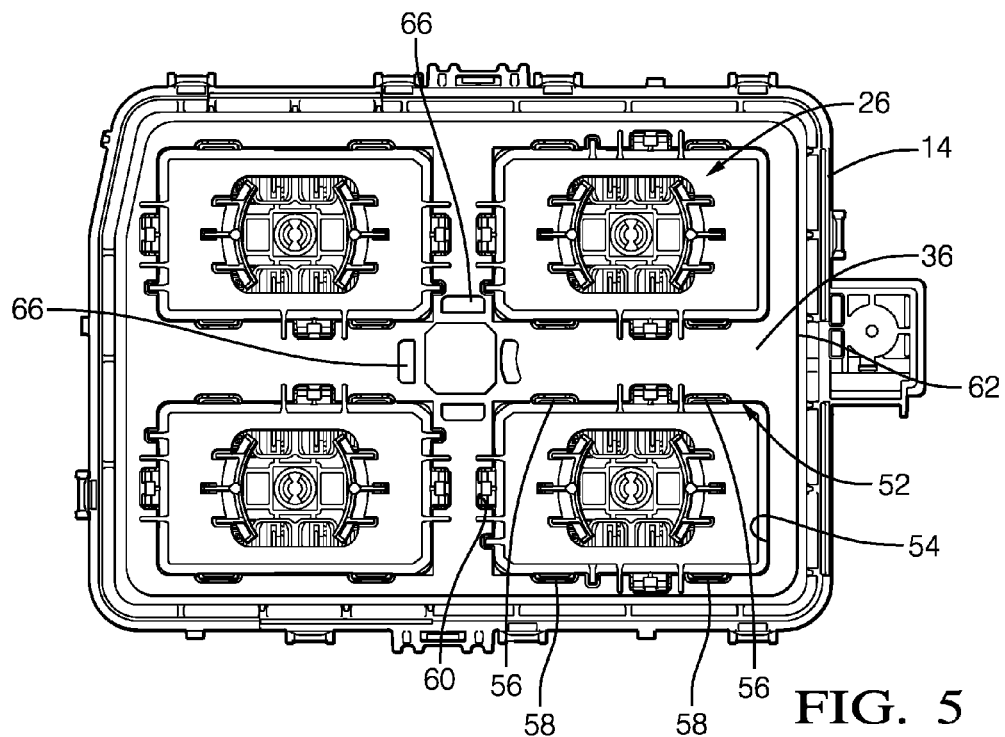
FIG. 5 is a bottom view of a portion of the assembled electrical distribution center including the lower housing, the mounting plate, and electrical connectors with the bracket omitted.
Figure 7:
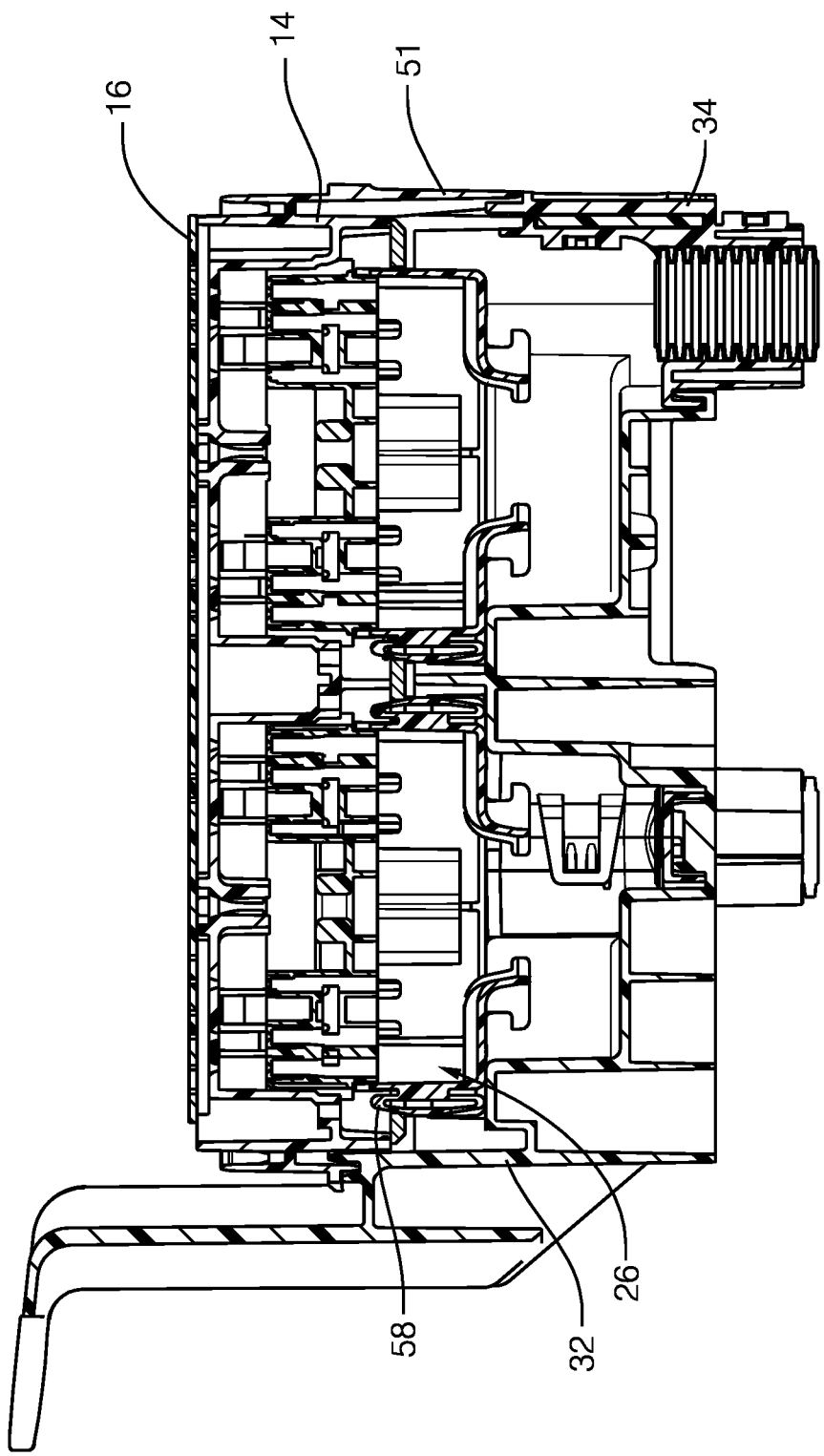
FIG. 7 is a cross-sectional view of the assembly as shown in FIG. 6, taken through the electrical connectors and with the circuit board installed.

The locating structure may be provided by, for example, spring arms 58 provided on the electrical connectors 26 that cooperate with notches 56 provided in the aperture 52, shown in FIGS. 3, 5 and 7. This configuration provides centering of the electrical connector 26 with respect to the mounting plate 36. Opposing edges 60 may be provided on the electrical connectors 26, for example, on the first connector portion 28, which may be arranged immediately beneath the underside 61 of the mounting plate 36 such that the electrical connector 26 is at least partially obstructed by the mounting plate 36 and cannot be pulled out once the mounting plate 36 has been secured to the bracket 32.

Figure 8:
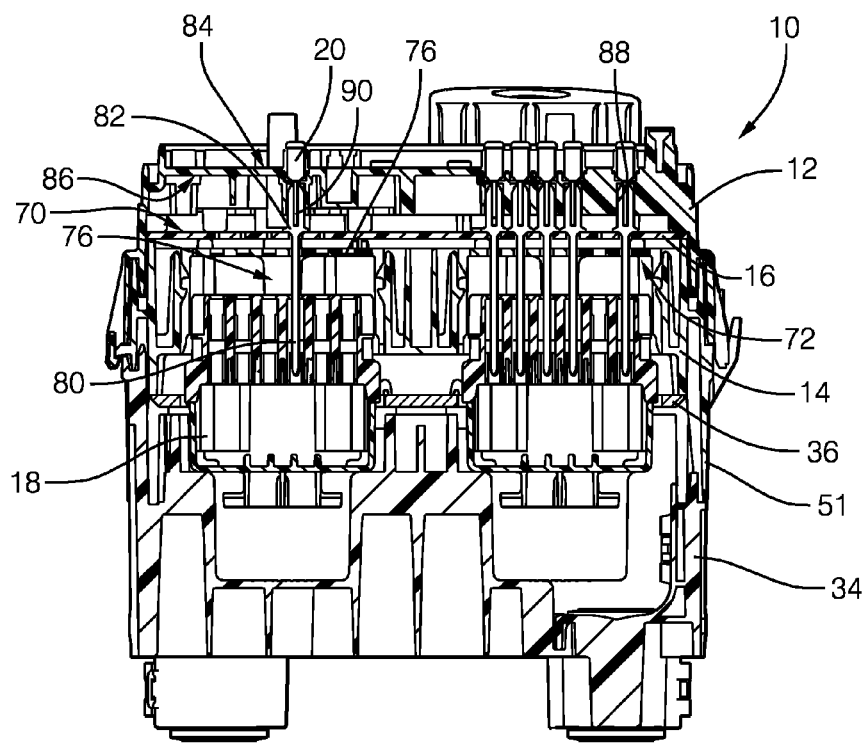
FIG. 8 is a cross-sectional view through line 8-8 in FIG. 1.

The electrical connectors 26 are received in pockets 74 in a lower side 72 of the lower housing 14 with the lower housing 14 installed onto the bracket 32, as shown in FIG. 8. Flanges 51 that extend from the lower housing 14 are received in the windows 46 to retain the grommets 34 (FIG. 6).

Figure 6:
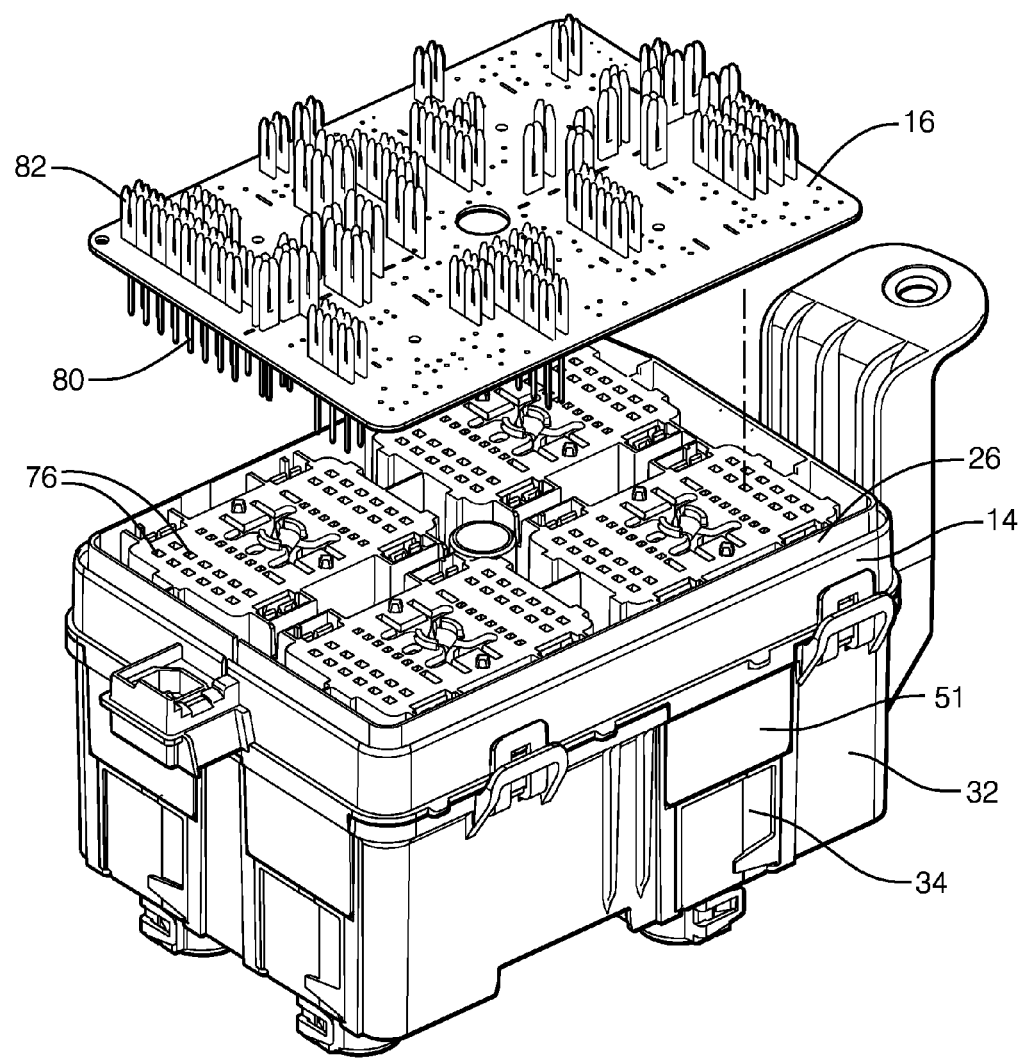
FIG. 6 is an exploded perspective view similar to that of FIG. 4, but with the lower housing installed and a circuit board removed.

Referring to FIGS. 6-8, the circuit board 16 is arranged on the upper side 70 of the lower housing 14. Terminals 78 on the circuit board 16 include first and second terminal ends 80, 82 respectively extending from opposing sides. The first terminal ends 80 extend through holes 76 in the lower housing 14 to electrically connect with the wire terminals 44 (now shown) in the electrical connectors 26 and provide electrical continuity, as best shown in FIG. 8. Recesses 88 are provided on a lower side 86 of the upper housing 12 to receive the second terminal ends 82. Terminals 90 from the electrical components 18 are arranged at an upper side 84 of the upper housing 12 and are electrically connected to the second terminal ends 82.

In operation, the electrical distribution center 10 is assembled by arranging the electrical connectors 26 within the bracket 32. In one example, the wire bundles 40 are moved interiorly through the windows 46 into the bracket 32, and the grommets 34 are slid into the windows 46 using the lateral edges 48 and grooves 50. The mounting plate 36 is snap-fit into the bracket 32 over the electrical connectors 26 with at least a portion of the electrical connector 26 extending through the aperture 52. The locating structures on the electrical connectors 26 cooperate with features on the mounting plate 36, which align and retain the electrical connectors 26 relative to the bracket 32 using the aperture 52.

The upper and lower housings 12, 14 are secured to one another about the circuit board 16. Hooks 92 on the upper housing 12 are snap-fit with catches 94 provided on the lower housing 14.

The lower housing 14 is installed onto the bracket 32 over the mounting plate 36 and electrical connectors 26. Hooks 96 on the bracket 32 are snap-fit with catches 98 on the upper housing 12. At the same time, the grommets 34 are retained by the flanges 51 of the lower housing 14 and arranged within the windows 46. The electrical connectors 26 are received within the corresponding pockets 74 in the lower side 72 of the lower housing 14. The first terminal ends 80 of terminals 78 electrically connect the circuit board 16 to the electrical connectors 26.

The second fastening element 102 is secured to the first fastening element 100 to clamp the components of the electrical distribution center 10 to one another to maintain a secure electrical connection between the circuit board 16 and the electrical connectors 26.

The electrical components 18 are installed at the upper side 84 of the upper housing 12 to electrically connect the electrical components 18 to the circuit board 16 and thereby the electrical connectors 26. An access cover (not shown) is secured to the upper housing 12 over the electrical components 18.

In the disclosed example, six fasteners are eliminated by providing electrical connector guidance with the mounting plate. This reduces the cost of the electrical distribution center and also reduces assembly time.

It should be understood that the terms "upper," "lower," "top," "bottom," "side" are used for convenience only and are in no way intended to be limiting. It should also be understood that although a particular component arrangement is disclosed in the illustrated embodiment, other arrangements will benefit herefrom. Although particular step sequences are shown, described, and claimed, it should be understood that steps may be performed in any order, separated or combined unless otherwise indicated and will still benefit from the present invention.

Although the different examples have specific components shown in the illustrations, embodiments of this invention are not limited to those particular combinations. It is possible to use some of the components or features from one of the examples in combination with features or components from another one of the examples.

Although an example embodiment has been disclosed, a person having ordinary skill in this art would recognize that certain modifications would come within the scope of the claims. For that reason, the following claims should be studied to determine their true scope and content.

We claim:

1. An electrical distribution center comprising:
   a bracket;
   a mounting plate is secured to the bracket and includes an aperture having a perimeter; and
   an electrical connector is disposed within the aperture and includes locating structure that is captured between the perimeter and the bracket to align and to retain the electrical connector relative to the bracket, wherein the mounting plate includes a plurality of the apertures, and a corresponding plurality of the electrical connectors are each arranged in a respective one of the apertures, and the bracket includes a first fastening element, and comprising a second fastening element that threadingly engages the first fastening element in an assembled condition, at least one of the first and second fastening elements passes through the mounting plate outside of the electrical connectors.

2. The electrical distribution center according to claim 1, wherein the bracket includes a retaining feature configured to interlock with the mounting plate in an assembled condition.

3. The electrical distribution center according to claim 2, wherein the retaining feature includes perimeter tabs that cooperate with an outer periphery of the mounting plate.

4. The electrical distribution center according to claim 2, wherein the retaining feature includes fingers that cooperate with slots in the mounting plate.

5. The electrical distribution center according to claim 1, comprising a circuit board arranged between an upper housing and a lower housing, the circuit board is electrically engaged with the electrical connectors on a lower side of the lower housing.

6. The electrical distribution center according to claim 5, comprising electrical components electrically engaged with the circuit board on an upper side of the upper housing, wherein a lower side of the upper housing faces an upper side of the lower housing, wherein electrical terminals extend from the circuit board into the upper and lower housings.

7. The electrical distribution center according to claim 5, wherein the bracket includes a perimeter wall with a window, and comprising a grommet that supports a wire bundle terminating in the electrical connector, the grommet is received in the window and is retained in the bracket by the lower housing.

8. The electrical distribution center according to claim 1, wherein the locating structure includes spring arms that cooperate with notches provided by the aperture.

9. The electrical distribution center according to claim 1, wherein the locating structure includes an edge captured beneath a periphery of the aperture.

10. A method of assembling an electrical distribution center comprising the steps of:
   arranging an electrical connector within a bracket;
   inserting a mounting plate with an aperture into the bracket over the electrical connector to align and retain the electrical connector relative to the bracket with the aperture;

installing a lower housing onto the bracket over the mounting plate and electrical connectors;

electrically connecting a circuit board into the electrical connector from an upper side of the lower housing;

installing the lower housing onto an upper housing;

electrically connecting electrical components to the circuit board from an upper side of the upper housing; and threading a second fastening element to a first fastening element supported by the bracket to clamp the bracket, the mounting plate, the electrical connector, the upper housing, the circuit board and the lower housing to one another to provide an assembled electrical distribution center.

11. The method according to claim 10, comprising the step of sliding a grommet that supports a wire bundle terminating in the electrical connector into a window of the bracket, and retaining the grommet in the bracket with the lower housing.

12. The method according to claim 11, comprising the step of snapping the upper and lower housings to one another while snapping the upper housing to the bracket.

13. The method according to claim 10, wherein the first and second fastening elements are arranged outside of the electrical connector.

14. The method according to claim 10, wherein the inserting step includes snapping spring arms on the electrical connector into the aperture.

15. The method according to claim 10, wherein the inserting step includes capturing an edge of the electrical connector with a periphery of the aperture.

* * * * *